US005703372A

United States Patent [19]

Horsky et al.

[11] Patent Number: 5,703,372

[45] Date of Patent: Dec. 30, 1997

[54] ENDCAP FOR INDIRECTLY HEATED CATHODE OF ION SOURCE

[75] Inventors: Thomas N. Horsky, Boxborough; William E. Reynolds, Topsfield; Richard M. Cloutier, Salisbury, all of Mass.

[73] Assignee: Eaton Corporation, Cleveland, Ohio

[21] Appl. No.: 775,145

[22] Filed: Dec. 31, 1996

Related U.S. Application Data

[63] Continuation-in-part of Ser. No. 740,478, Oct. 30, 1996.

[51] Int. Cl.[6] .......... H01J 37/08

[52] U.S. Cl. .......... 250/423 R; 250/427

[58] Field of Search .......... 250/423 R, 427, 250/492.21; 313/362.1; 315/111.81

[56] References Cited

U.S. PATENT DOCUMENTS

| | | | |
|---|---|---|---|
| 4,506,160 | 3/1985 | Sugawara et al. | 250/427 |
| 4,641,031 | 2/1987 | Ito et al. | 250/423 R |
| 4,672,210 | 6/1987 | Armstrong et al. | 250/492.2 |
| 5,026,997 | 6/1991 | Benveniste | 250/492.2 |
| 5,262,652 | 11/1993 | Bright et al. | 250/492.2 |
| 5,391,962 | 2/1995 | Roberts et al. | 250/427 |
| 5,420,415 | 5/1995 | Trueira | 250/492.21 |
| 5,497,006 | 3/1996 | Sferlazzo et al. | 250/427 |

*Primary Examiner*—Kiet T. Nguyen
*Attorney, Agent, or Firm*—Watts, Hoffman, Fisher & Heinke Co., L.P.A.

[57] ABSTRACT

An ion source for use in an ion implanter. The ion source comprises a gas confinement chamber having conductive chamber walls that bound a gas ionization zone. The gas confinement chamber includes an exit opening to allow ions to exit the chamber. A base positions the gas confinement chamber relative to structure for forming an ion beam from ions exiting the gas confinement chamber. A portion of a cathode extends into an opening in the gas confinement chamber. The cathode includes a cathode body defining an interior region in which a filament is disposed. The cathode body comprises an inner tubular member a coaxial outer tubular member and an endcap having a reduced cross section body portion with a radially extending rim. The endcap is pressed into the inner tubular member. The filament is energized to heat the endcap which, in turn, emits electrons into the gas ionization zone. The filament is protected from energized plasma in the gas ionization zone by the cathode body.

24 Claims, 8 Drawing Sheets

162

ENDCAP FOR INDIRECTLY HEATED CATHODE OF ION SOURCE

CROSS REFERENCE TO RELATED APPLICATION

This application is a continuation-in-part of U.S. patent application Ser. No. 08/740,478, filed Oct. 30, 1996 and entitled "CATHODE MOUNTING FOR ION SOURCE WITH INDIRECTLY HEATED CATHODE."

FIELD OF THE INVENTION

The present invention relates to an ion implanter having an ion generating source that emits ions to form an ion beam for beam treatment of a workpiece and, more particularly, to an endcap for an indirectly heated cathode of an ion generating source.

BACKGROUND ART

Ion implanters have been used for treating silicon wafers by bombardment of the wafers with an ion beam. The ion beam dopes the wafers with impurities of controlled concentration to yield a semiconductor wafer that in turn is used to fabricate an integrated circuit. One important factor in such implanters is the throughput or number of wafers that can be treated in a given time.

High current ion implanters include a spinning disk support for moving multiple silicon wafers through the ion beam. The ion beam impacts the wafer surface as the support rotates the wafers through the ion beam.

Medium current implanters treat one wafer at a time. The wafers are supported in a cassette and are withdrawn one at time and placed on a platen. The wafer is then oriented in an implantation orientation so that the ion beam strikes the single wafer. These medium current implanters use beam shaping electronics to deflect a relatively narrow beam from its initial trajectory to selectively dope or treat the entire wafer surface.

Ion sources that generate the ion beams used in existing implanters typically include heated filament cathodes that tend to degrade with use. After relatively short periods of use, the filament cathodes must be replaced so that ions can again be generated with sufficient efficiency. Maximizing the interval between filament cathode replacement increases the amount of time wafers are being implanted and, thus, increases the efficiency of the implanter.

U.S. Pat. No. 5,497,006 to Sferlazzo et al. (hereinafter "the '006 patent") concerns an ion source having a cathode supported by a base and positioned with respect to a gas confinement or arc chamber for ejecting ionizing electrons into the gas confinement chamber. The cathode of the '006 patent is a tubular conductive body and endcap that partially extends into the gas confinement chamber. A filament is supported within the tubular body and emits electrons that heat the endcap through electron bombardment, thermionically emitting the ionizing electrons into the gas confinement chamber.

DISCLOSURE OF THE INVENTION

The present invention is directed to an ion implanter using a new and improved ion generating source. The ion generating source of the present invention uses a cathode that shields a cathode filament from the plasma stream. The cathode has an increased service life compared to prior art ion implanters. The cathode of the present invention is robust against sputtering by plasma ions as compared to an immersed cathode filament.

An ion source constructed in accordance with the present invention includes a gas confinement or arc chamber having chamber walls that bound a gas ionization region and includes an exit opening to allow ions to exit the gas confinement chamber. A gas delivery system delivers an ionizable gas into the gas confinement chamber. A base supports the gas confinement chamber in a position relative to structure for forming an ion beam as ions exit the gas confinement chamber.

A cathode is positioned with respect to the ionization region of said gas confinement chamber to emit ionizing electrons into the ionization region of the gas confinement chamber. An insulator is attached to the gas confinement chamber for supporting the cathode and electrically insulating the cathode from the gas confinement chamber. The cathode includes a conductive cathode body that bounds an interior region and has an outer surface that extends into said gas confinement chamber interior. A filament is supported by the insulator at a position inside the interior region of the conductive body of said cathode for heating an endcap of the conductive cathode body to cause ionizing electrons to be emitted from the endcap into said gas confinement chamber.

The insulator both aligns the cathode with respect to the gas confinement chamber but also allows the filament to be electrically isolated from the cathode body. The preferred insulator is a ceramic block constructed from alumina. This block includes an insulator body that defines notches that extend inwardly from exposed surfaces of the insulator body to impede coating of the exposed surfaces by material emitted by the source during operation of the ion source. This insulator design has decreased source failure due to deposition of conductive materials onto the insulator.

The cathode body includes an inner tubular member or inner tube, an outer tubular member or outer tube and an endcap. A distal portion of the cathode body extends through an opening into the gas confinement chamber. The cathode body is supported by a metal mounting block which, in turn, is affixed to the insulator. The inner tubular member, preferably comprised of a molybdenum alloy, functions as a thermal break between the heated cathode endcap and the metal mounting block. The inner tubular member includes a threaded portion on its outer surface that threads into the metal mounting block. An inner surface of distal end of the inner tubular member is counterbored defining a counterbored region which receives the endcap and includes a tapered radial fin or ridge extending inwardly. The outer tubular member, also preferably comprised of a molybdenum alloy, functions to protect the inner tubular member from the energized plasma in the gas confinement chamber. The outer tubular member includes a threaded portion on its inner surface which threads onto the inner tubular member to hold the outer tubular member in place.

The endcap is cylindrically shaped and includes a first end and a second end spaced apart by a body portion. The body portion includes a radial rim extending outwardly from a central portion of the body portion. Preferably, the endcap is comprised of wrought tungsten. The endcap is press fit into the counterbored distal end of inner tubular member. An outer periphery of the endcap rim has an interference fit with the inwardly extending radial ridge of the inner surface of the inner tubular member and an edge of the rim is seated on a stepped portion of the inner surface defined by an end of the counterbored region to hold the endcap in place in the inner tubular member distal end. The filament is adjacent the first end of the endcap disposed in the inner tubular member while the second or emitter end of the endcap extends beyond the distal end of the inner tubular member into the gas confinement chamber. When the filament is energized, the endcap is heated and the emitter end thermonically emits electrons into the gas confinement chamber. The area of contact between the endcap and the inner tubular member is limited to a small portion of the rim. This small area of contact between the endcap and the inner tubular member minimizes thermal transfer from the endcap to the inner tubular member and, hence, to the outer tubular member and the metal mounting block which are threaded onto the inner tubular member thereby increasing component life and increasing the heating efficiency of the filament. Further, the extending rim of the endcap permits the cylindrical body portion of the endcap to have a substantially reduced cross sectional area as compared to the cross sectional area of the inner tubular member (approximately a 50% reduction in cross sectional area).

The reduced cross sectional area of the endcap provides for more efficient use of filament heating power, thus, less power is required for a given desired arc current. Moreover, for a given filament power level, the smaller cross sectional area of the second or emitter end of the endcap results in an increased current density of the arc current flowing into the gas confinement chamber and a higher emitter end temperature. The increased current density and higher emitter end temperature advantageously provide for: a) increased disassociation of singly charged ions, e.g., disassociation of $BF_2$ and $BF_3$; and b) increased production of multiply charged ions, e.g., increased production of B++ and B+++ ions.

Further features of the present invention will become apparent to those skilled in the art to which the present invention relates from reading the following specification with reference to the accompanying drawings.

BEST MODE FOR PRACTICING THE INVENTION

Figure 1:
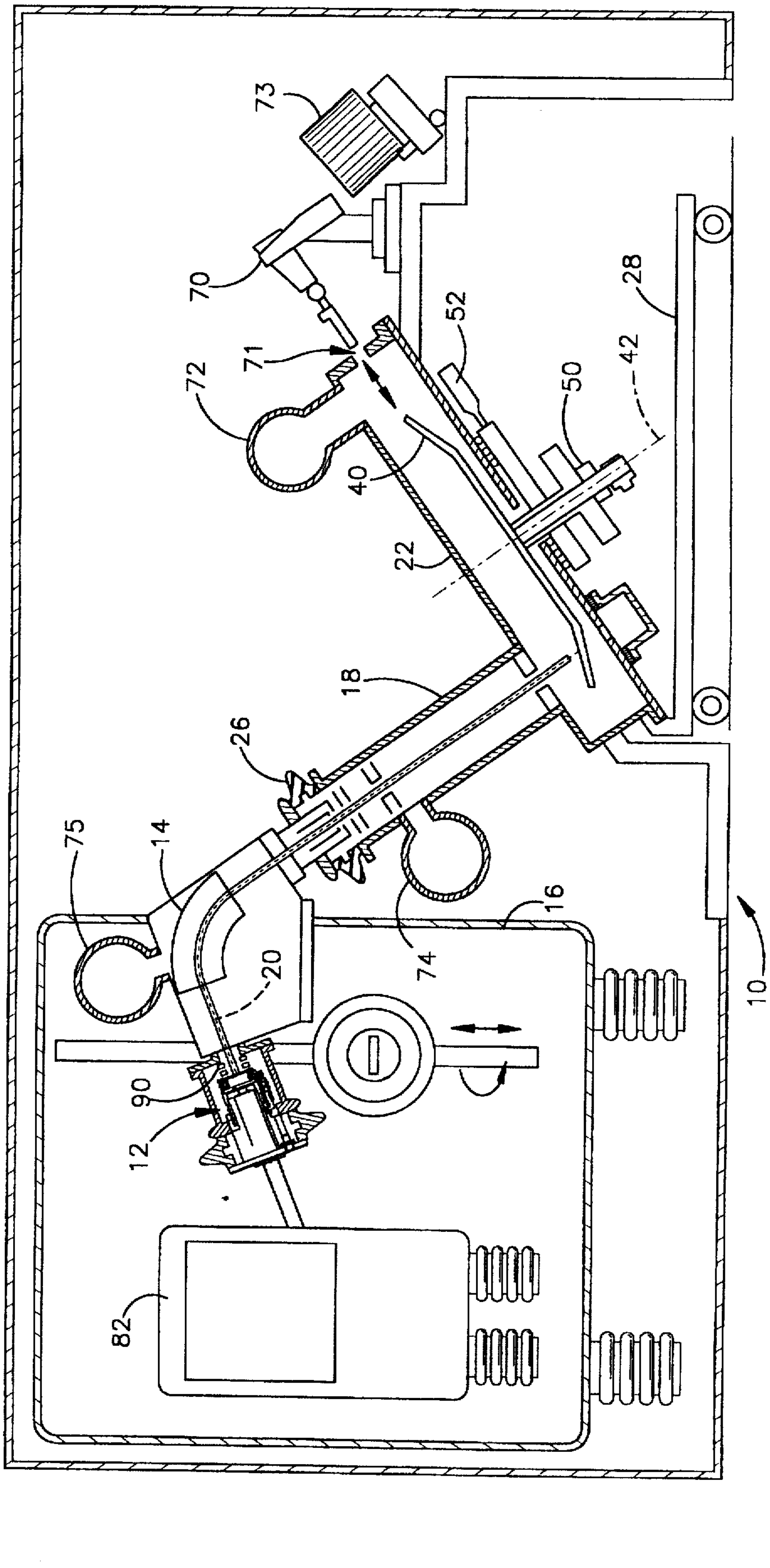
FIG. 1 is schematic view of an ion implanter for ion beam treatment of a workpiece such as a silicon wafer mounted on a spinning support.

FIG. 1 illustrates an ion implantation system 10 having an ion generating source 12 that embodies the present invention and a beam analyzing magnet 14 supported by a high-voltage housing 16. An ion beam 20 emanating from the ion source 12 follows a controlled travel path that exits the housing 16 travels through an evacuated tube 18 and enters an ion implantation chamber 22. Along the travel path of the ion beam 20 from the ion source 12 to the implantation chamber 22, the beam is shaped, filtered, and accelerated to a desired implantation energy.

The analyzing magnet 14 causes only those ions having an appropriate mass to charge ratio to reach the ion implantation chamber 22. In the region that the ion beam 20 exits the housing 16, the beam passes through a high-voltage isolation bushing 26 constructed from an electric insulating material that isolates the high-voltage housing 16 from the implantation chamber 22.

The ion implantation chamber 22 is supported on a movable pedestal 28 that allows the implantation chamber to be aligned relative to the ion beam 20. The ion beam 20 impinges upon one or more silicon wafers supported on a wafer support 40 which is mounted for rotation about an axis 42. The wafer support 40 supports multiple silicon wafers around its outer periphery and moves those wafers along a circular path. The ion beam 20 impacts each of the wafers and selectively dopes those wafers with ion impurities. High-speed rotation of the wafer support 40 is effected by a motor 50 which rotates the support 40 and wafers. A linear drive 52 causes the support 40 to be indexed back and forth within the ion implantation chamber 22. The wafer support 40 is positioned so that untreated wafers can be moved into the chamber 22 and treated wafers withdrawn from the chamber. Additional details concerning prior art ion implantation systems are contained in U.S. Pat. No. 4,672,210 to Armstrong et al., and which is assigned to the assignee of the present invention, the subject matter of which is incorporated herein by reference.

Silicon wafers are inserted into the ion implantation chamber 22 by a robotic arm 70 through a vacuum port 71. The chamber 22 is evacuated by a vacuum pump 72 to a low pressure equal to the pressure along the evacuated tube 18. The robotic arm 70 transfers wafers back and forth between a cassette 73 for storing the wafers. Mechanisms for accomplishing this transfer are well known in the prior art. Additional vacuum pumps 74, 75 evacuate the ion beam path from the source 12 to the implantation chamber 22.

Figure 4:
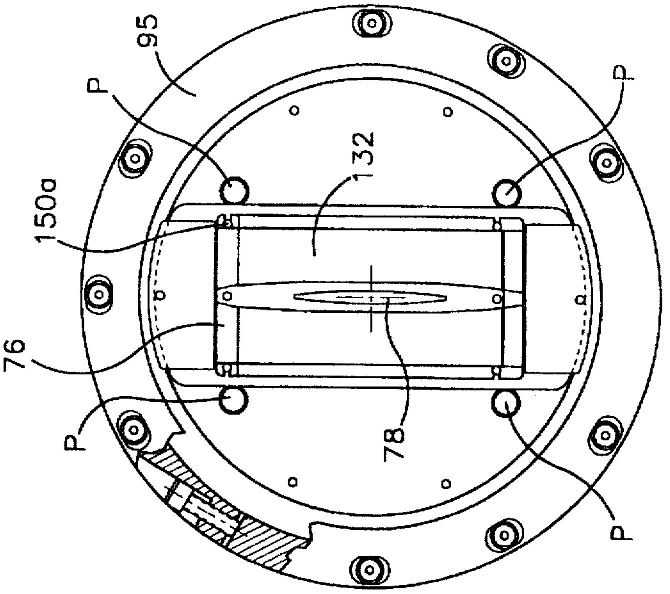
FIG. 4 is an elevation view of the ion generating source showing an arc slit through which ions exit the ion source.
Figure 3:
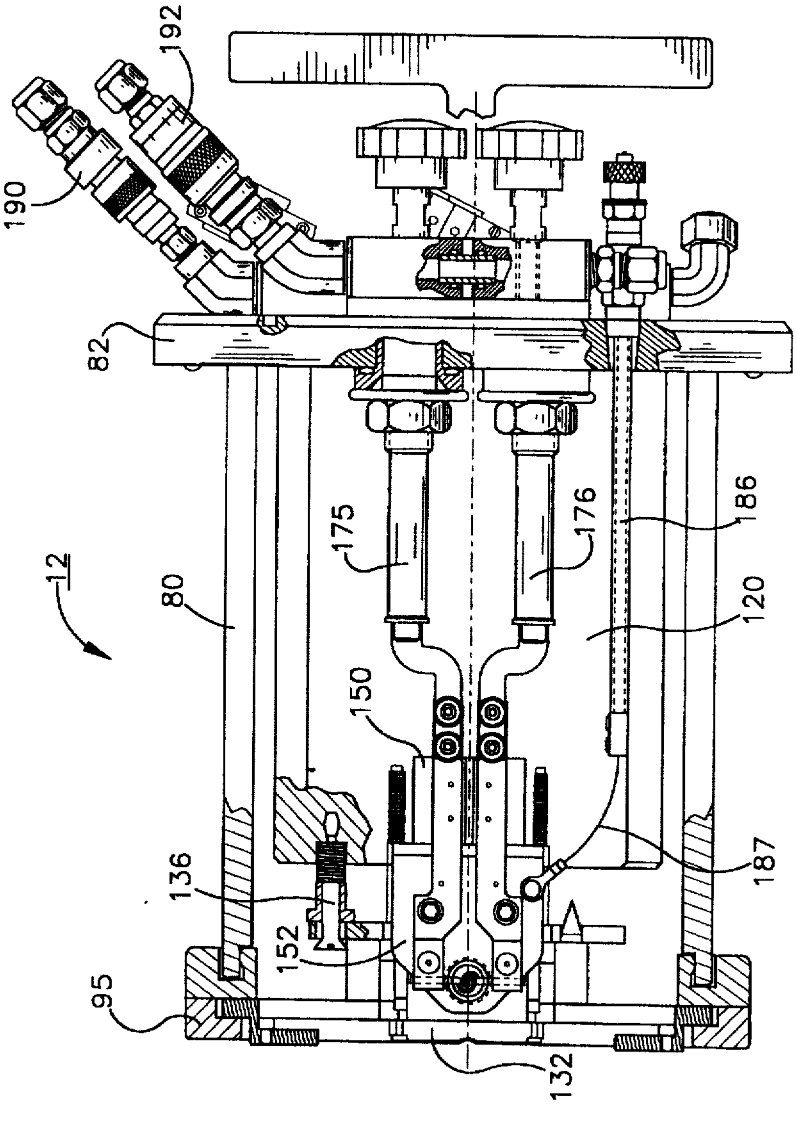
FIG. 3 is a plan view of the ion generating source showing an electrical connection for energizing a shielded filament that forms part of the source cathode.

The source 12 includes a high-density plasma arc chamber 76 (FIG. 2) having an elongated, generally elliptically shaped exit aperture 78 in its front wall through which ions exit the source (FIG. 4). The arc chamber 76 is positioned relative to the ion beam path by a generally cylindrical source housing 80 mounted to a flange 82 supported within the high voltage housing 16. Additional details concerning one prior art ion source are disclosed in U.S. Pat. No. 5,026,997 to Benveniste et al., which is assigned to the assignee of the present invention and which is incorporated herein by reference. As ions migrate from the plasma arc chamber 76, they are accelerated away from the chamber 76 by electric fields set up by extraction electrodes 90 (FIG. 1) positioned just outside the exit aperture. The analyzing magnet 14 produces a magnetic field that bends ions having the correct mass to charge ratio to an implant trajectory. These ions exit the analyzing magnet 14 and are accelerated along a travel path leading to the implantation chamber 22. An implanter controller 82 is located within the high-voltage housing 16 and adjusts the field strength of the analyzing magnet 14 by controlling current in the magnet's field windings.

The source 12 produces a large fraction of ions having a mass different from the ions used for implantation. These unwanted ions are also bent by the analyzing magnet 14 but are separated from the implantation trajectory. Heavy ions follow a large radius trajectory, for example, and ions that are lighter than those used for implantation follow a tighter radius trajectory.

ION SOURCE 12

The ion generating source 12 (FIGS. 2–5) embodying the present invention includes a source block 120 supported by a rear wall 82 of the source housing 80. The source block 120, in turn, supports the plasma arc chamber 76 and an electron emitting cathode 124 that in the preferred embodiment of the present invention is supported by, but electrically isolated from, the arc chamber 76.

A source magnet (not shown) encircles the plasma arc chamber 76 (FIGS. 14–18) to confine the plasma generating electrons to tightly constrained travel paths within the arc chamber 76. The source block 120 also defines cavities that accommodate vaporizer ovens 122, 123 that can be filled with vaporizable solids such as arsenic that are vaporized to a gas and then injected into the plasma chamber 76 by means of delivery nozzles 126, 128.

The plasma arc chamber 76 is an elongated metal form which defines an interior ionization region R (FIGS. 2, 7, 8 and 14) bounded by two elongated side walls 130*a*, 130*b* (FIG. 8) top and bottom walls 130*c*, 130*d* and a front wall defining plate 132 that abuts the ionization region R. Extending outwardly from its two side walls 130*a*, 130*b*, the arc chamber 76 includes a support flange 134 for mounting the arc chamber.

The plate 132 is aligned relative to the source housing 80. As described in U.S. Pat. No. 5,420,415 to Trueira, assigned to the assignee of the present invention and which is incorporated herein by reference, the plate 132 is attached to an alignment fixture 95 (FIGS. 3 and 4) that attaches to the source housing 80. Briefly, the alignment fixture 95 is inserted into the source housing 80 such that the plane of the fixture is perpendicular to the ion beam axis. Once in position, the ion source couples to the alignment fixture 95 by being captured on bullet head pins P (FIG. 4) attached to the alignment fixture.

Four elongated bolts 136 threaded at their ends pass through four openings 138 in the flange 134 and engage threaded openings 140 in the source block 120. The bolts 136 pass through bushings 146 (FIG. 8) and springs 148 that bias the arc chamber 76 away from the source block 120 to facilitate capture of the arc chamber by the alignment fixture 95.

Figure 8:
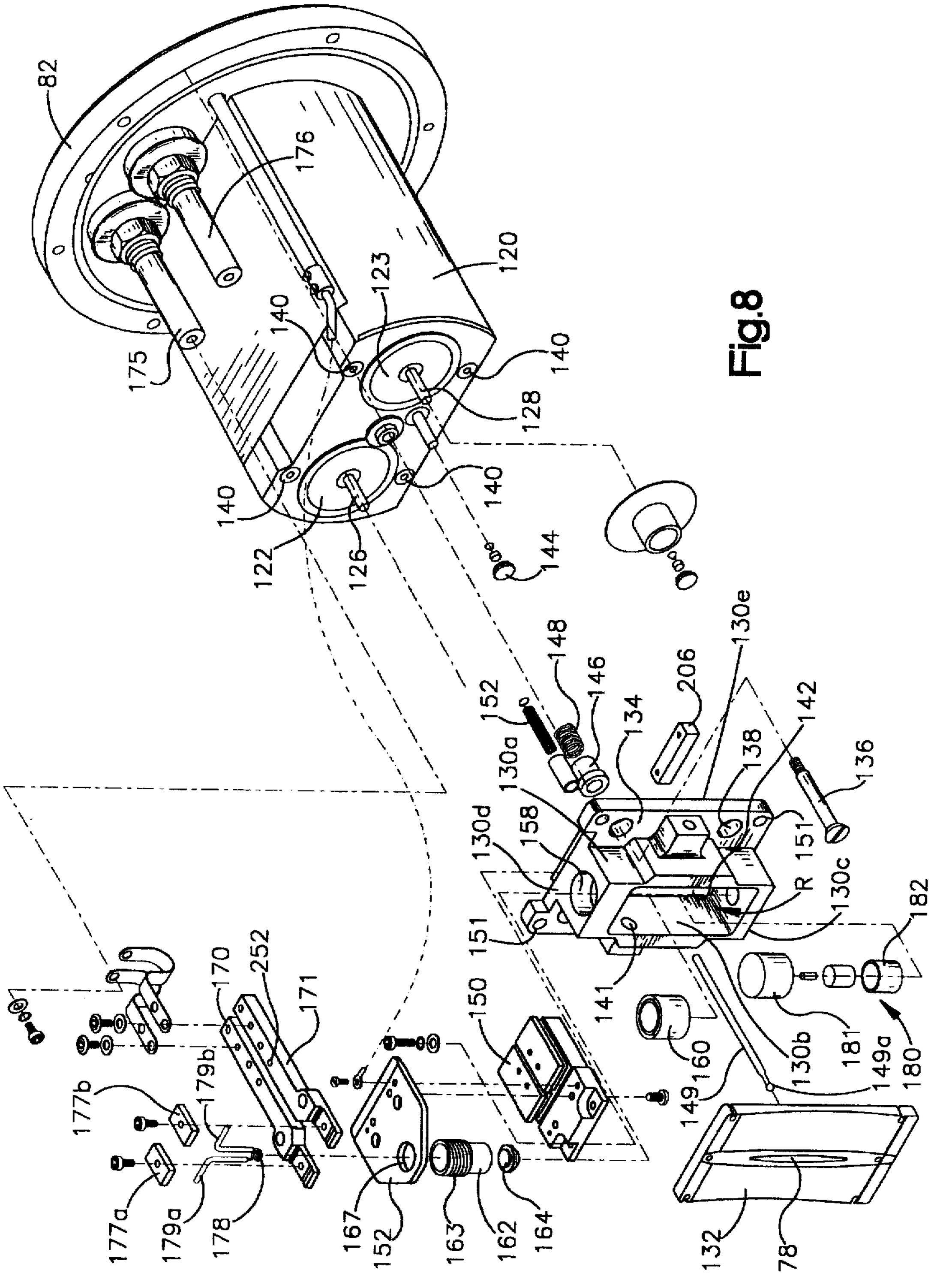
FIG. 8 is an exploded perspective view of an ion source constructed in accordance with the invention.
Figure 9:
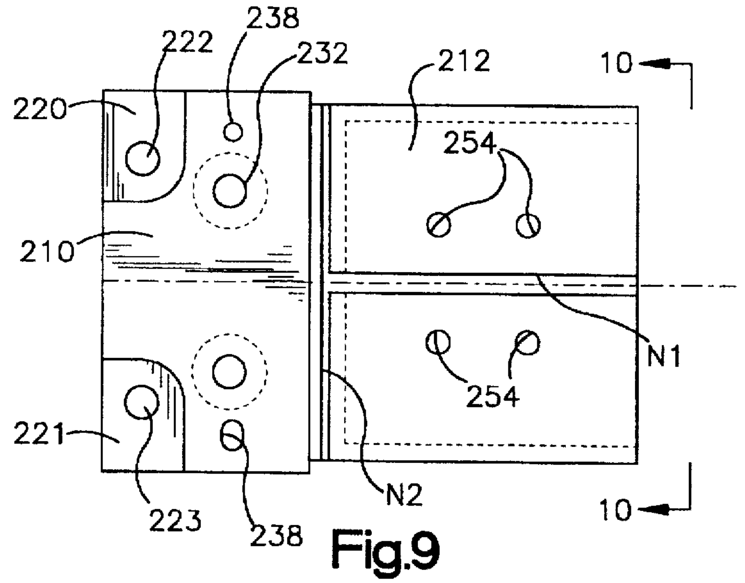
FIG. 9 is a top plan view of an insulating block used to electrically isolate the source cathode from an ion plasma chamber.

Four pins 149 (only one of which is seen in FIG. 8) extend through openings 151 in the four corners of the arc chamber's flange 134. These pins are spring biased away from the source block 120 by means of springs 152. Slightly enlarged ends 149*a* of the pins fit within the plate 132 and keep the plate and arc chamber 76 connected together.

Vaporized material is injected into the interior of the plasma arc chamber 76 from the support block 120 by the delivery nozzles 126, 128. On opposite sides of the arc chamber 76, passageways 141 extend from a rear of the chamber 76 through a chamber body and open into the interior of the plasma arc chamber 76. Additionally, gas can be directly routed into the arc chamber 76 by means of a port or opening 142 in a rear wall 130*e* of the chamber. A nozzle 144 abuts the opening 142 and injects gas directly into the arc chamber 76 from a source or supply external to the ion source.

CATHODE 124

The wall 130*d* defines an opening 158 (FIGS. 8 and 18) sized to allow a cathode 124 (FIG. 2) to extend into an interior of the plasma arc chamber 76 without touching the chamber wall 130*d* that defines the opening 158. The cathode 124 is supported by an insulating mounting block 150 that is attached the rear of the arc chamber 76. The cathode 124 includes a cathode body 300 (FIG. 6) that fits into the arc chamber opening 158. The cathode body 300 is mounted to a metal mounting plate 152 (FIGS. 6 and 8) which, in turn, is supported by the insulating mounting block 150.

Figure 6:
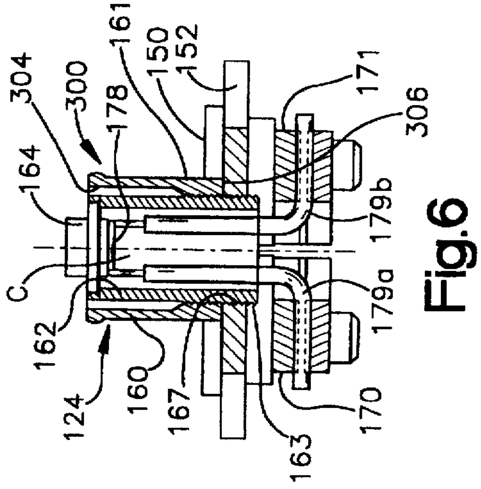
FIG. 6 is a view from the line 6—6 in FIG. 5.

The cathode body 300 is constructed from three metallic members: an outer tube or outer tubular member 160, an inner tube or inner tubular member 162, which is coaxial with the outer tubular member, and an endcap 164. The outer tubular member 160 of the cathode body 300 preferably is made from a molybdenum alloy material and functions to protect the inner tubular member 162 from energized plasma in the arc chamber 76. The inner tubular member 162 is also preferably made from a molybdenum alloy material and functions to support the endcap 164. The inner tubular member 162 includes an inner surface 301 that defines an interior region or cavity C in which a tungsten wire filament 178 is disposed and has an outer surface 302 (best seen in FIG. 6B) that includes a threaded lower or proximal end portion 163. The end portion 163 is threaded into a threaded opening 167 of the mounting plate 152 to secure the cathode body 300 to the mounting plate (FIG. 6). A lower or proximal portion 161 of an inner surface 304 of the outer tubular member 160 is also threaded. As can be seen in FIG. 6, the outer tubular member proximal portion 161 is threaded onto the inner tubular member threaded end portion 163 such that a proximal end 306 of the outer tubular member 160 abuts the mounting plate 152. The outer and inner tubular members 160, 162 are preferably cylindrical. When the cathode 124 is assembled, a distal end of the filament 178 is spaced approximately 0.030 inches from the endcap 164.

Figure 6A:
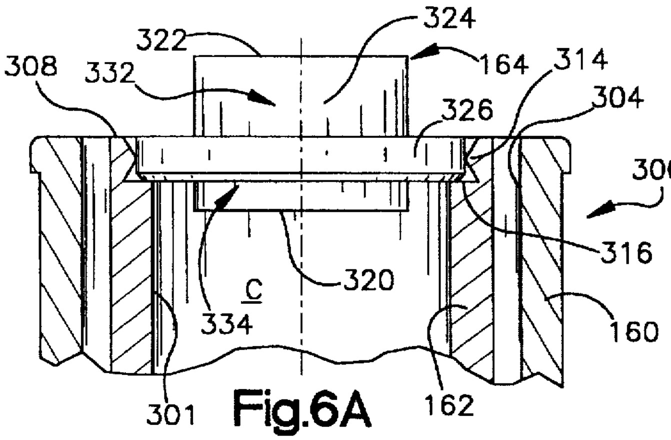
FIG. 6A is an enlarged sectional view of an end portion of the source cathode shown in FIG. 6 with the filament removed.
Figure 6D:
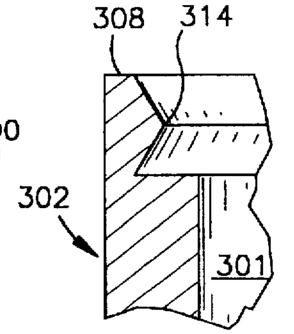
FIG. 6D is an enlarged sectional view of a distal end of the inner tubular member.
Figure 6B:
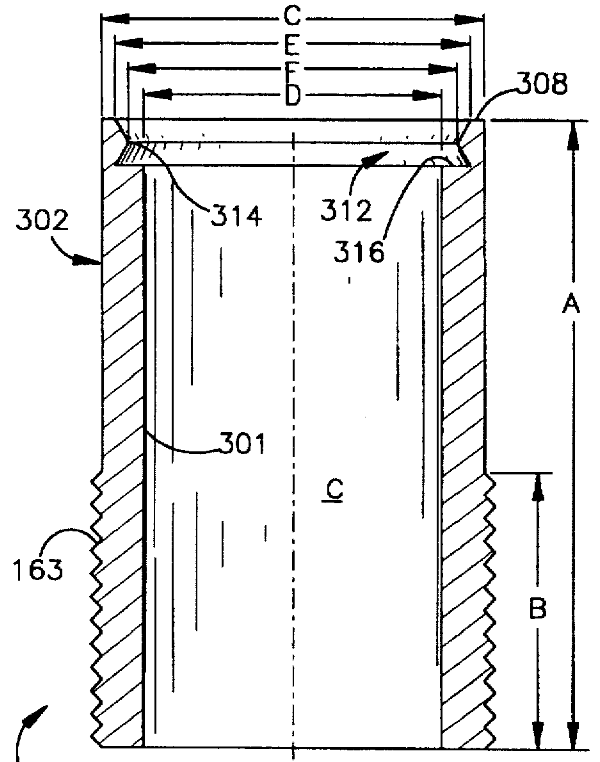
FIG. 6B is an enlarged sectional view of an inner tubular member which is part of a cathode body of the source cathode.
Figure 6C:
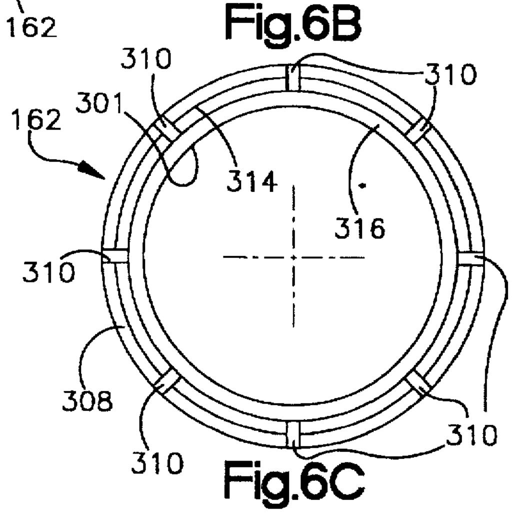
FIG. 6C is an enlarged top plan view of the inner tubular member of the source cathode.

As can be seen in FIG. 6C, an upper or distal end 308 of the inner tubular member 162 includes eight uniformly spaced radial slots 310 preferably having a width of 0.020 inches and a depth of 0.060 inches. The inner surface 301 of the inner tubular member 162 adjacent the distal end 308 is counterbored to receive the endcap 164. As can best be seen in FIG. 6A and 6B. The counterbored region 312 of the inner surface 301 includes a tapered radial fin or ridge 314 extending radially inwardly. The angle of taper of the edges of the ridge 314 is approximately 30 degrees with respect to vertical. Since the counterbored region 312 of the inner tubular member 162 has a decreased wall thickness compared to the wall thickness of the remainder of the inner tubular member, a step 316 is formed at a boundary or end of the counterbored region. The step 316 is approximately 0.065 inches below the distal end 308. As can be seen in FIG. 6A, when the endcap 164 is press fit into the inner tubular member 162, the endcap 164 is supported on the tapered ridge 314 and the step 316 of the inner tubular member. Referring to FIGS. 6B, suitable dimensions for the inner tubular member 162 are as follows:

| Description | Label | Dimension |
|---|---|---|
| Overall length | A | 0.95 inches |
| Length of threaded portion | B | 0.48 inches |
| Outer diameter | C | 0.560 inches |
| Inner diameter | D | 0.437 inches |
| Diameter of counterbored region excluding ridge 314 | E | 0.510 inches |
| Diameter of counterbored region including ridge 314 | F | 0.472 inches |

Two conductive mounting arms 170, 171 support the tungsten wire filament 178 inside the cathode inner tubular member 162. The arms 170, 171 are attached directly to the insulating block 150 by connectors 172 (FIG. 7) that pass through the arms to engage threaded openings in the block 150. Conductive energizing bands 173, 174 are coupled to the filament 178 and energized by signals routed through the flange 82 of the housing 80 via power feedthroughs 175, 176.

Figure 5:
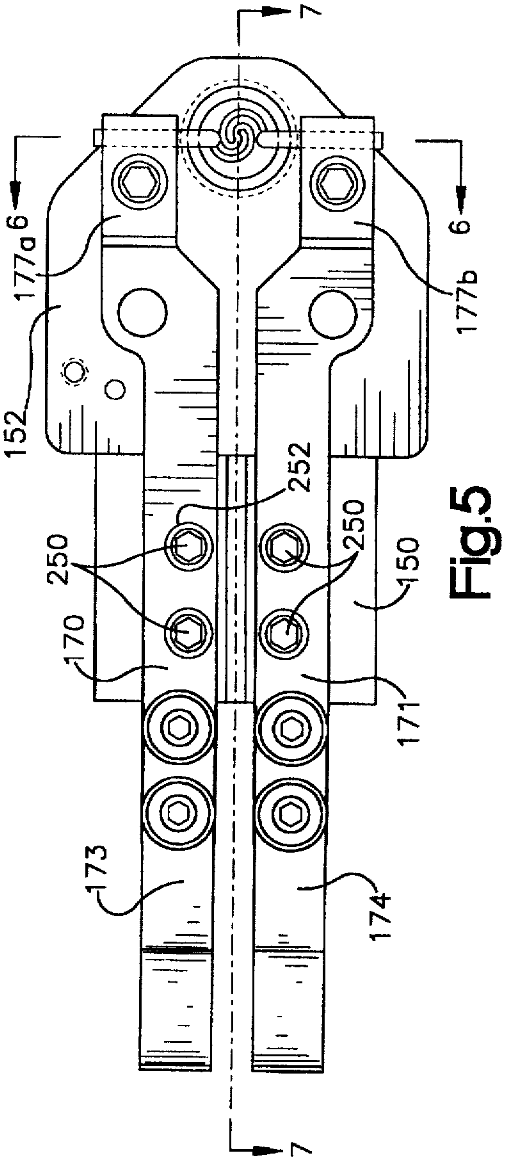
FIG. 5 is an enlarged plan view of structure for mounting the source cathode.
Figure 7:
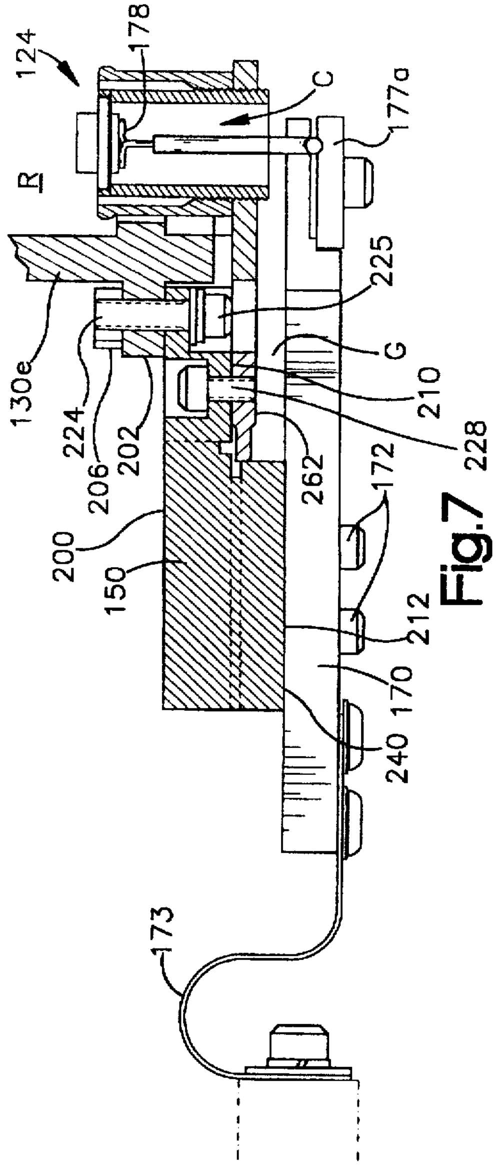
FIG. 7 is a view from the line 7—7 in FIG. 5.

Two clamps 177*a*, 177*b* fix the tungsten filament 178 within the cavity C defined by the innermost tubular member 162 of the cathode body 300. The filament 178 is made of a tungsten wire bent to form a helical loop (FIG. 5). Ends of the filament 178 are supported by first and second tantalum legs 179*a*, 179*b* held in electrical contact with the two arms 170, 171 by the clamps 177*a*, 177*b*.

When the tungsten wire filament 178 is energized by application of a potential difference across the power feedthroughs 175, 176 the filaments emit electrons which accelerate toward and impact the endcap 164 of the cathode 124. When the endcap 164 is sufficiently heated by electron bombardment, it in turn emits electrons into the arc chamber 76 which strike gas molecules and create ions within the arc chamber. An ion plasma is created and ions within this plasma exit the opening 78 to form the ion beam. The endcap 164 shields the filament 178 from contact with the ion plasma within the arc chamber 76 and extends the life of the filament. Additionally, the manner in which the filament 178 is supported within the cathode body 300 facilitates replacement of the filament.

REPELLER 180

Figure 2:
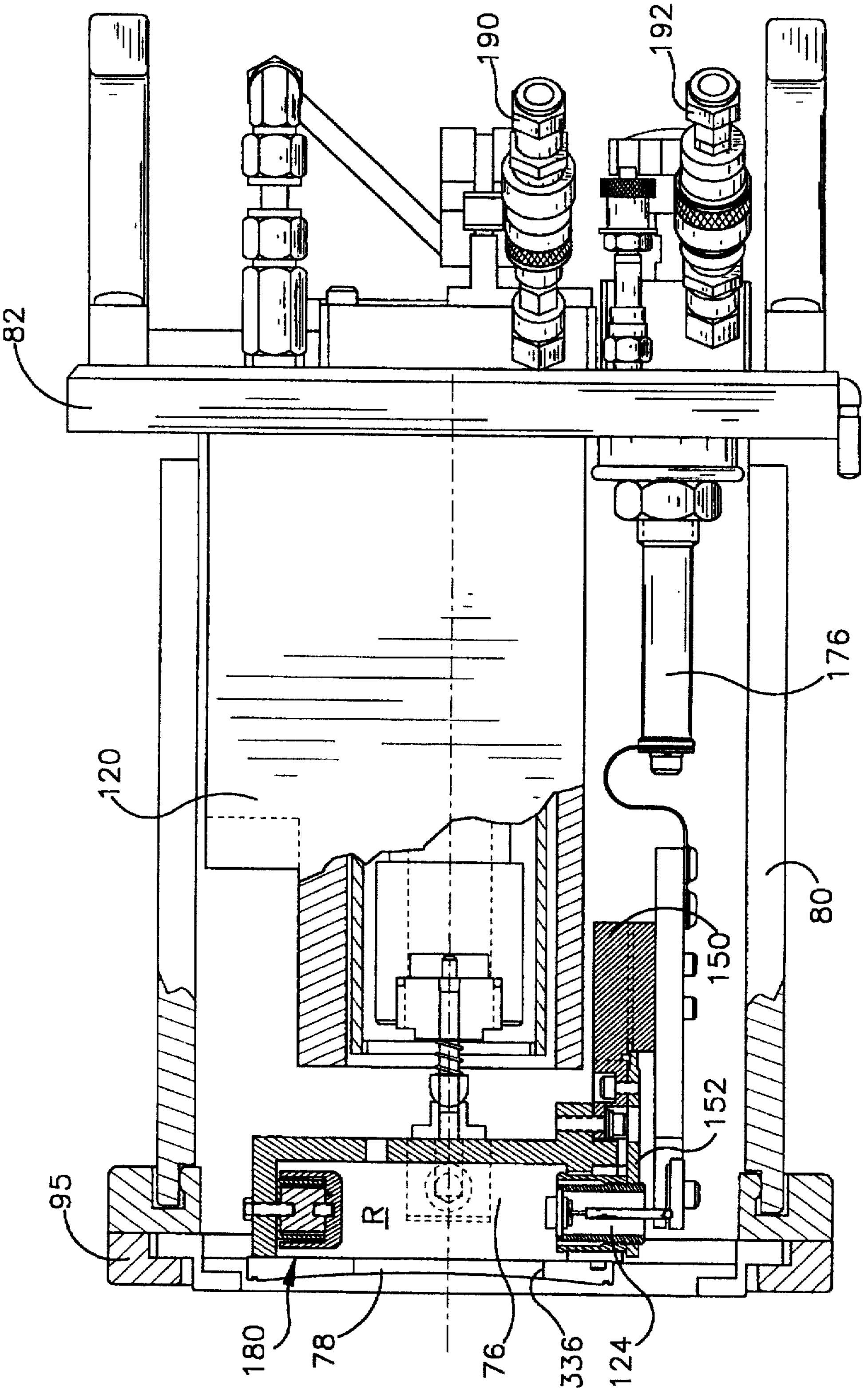
FIG. 2 is a partial cross-sectional view of an ion generating source embodying the present invention for creating an ion beam in the implanter of FIG. 1.

Electrons generated by the cathode 124 that are emitted into the arc chamber 76 but which do not engage a gas molecule within a gas ionization zone move to the vicinity of a repeller 180 (FIG. 2). The repeller 180 includes a metal member 181 (FIG. 8) located within the arc chamber 76 which deflects electrons back into the gas ionization zone to contact a gas molecule. The metal member 181 is made of molybdenum. A ceramic insulator 182 insulates the repeller member 181 from the electrical potential of the lower wall 130*c* of the plasma arc chamber 76. The cathode 124 and repeller 180 are therefore electrically and thermally isolated from the arc chamber walls. Shorting of the repeller member 181 is impeded by a metal cup that prevents ions from coating the insulator 182.

The walls of the arc chamber 76 are held at a local ground or reference electric potential. The cathode 124, including the cathode endcap 164, is held at a potential of between 50–150 volts below the local ground of the arc chamber walls. This electric potential is coupled to the plate 152 by a power feedthrough 186 for attaching an electrical conductor 187 (FIG. 3) to the plate 152 that supports the cathode body 300. The filament 178 is held at a voltage of between 200 and 600 volts below that of the endcap 164. The large voltage difference between the filament 178 and the cathode body 300 imparts a high energy to the electrons leaving the filament that is sufficient to heat the endcap 164 and thermionically emit electrons into the are chamber 76. The repeller member 181 is allowed to float at the electrical potential of the gas plasma within the chamber 76.

The '006 patent to Sferlazzo et al. depicts a schematic of a circuit that controls arc current between the cathode and the anode (chamber walls of the arc chamber). The operation of this circuit is described in the '006 patent and is also incorporated herein. During generation of ions, the source heats up due to the injection of ionizing energy into the arc chamber 76. Not all of this energy ionizes the gas within the arc chamber 76 and a certain amount of heat is generated. The arc chamber 76 includes water couplings 190, 192 that route cooling water into the source block and route heated water away from the region of the arc chamber.

INSULATING BLOCK 150

In addition to insulating the cathode 124 from the arc chamber 76, the insulating block 150 positions the filament 178 with respect to the cathode body 300 and the cathode body with respect to the arc chamber. FIGS. 9–12 depict the insulating block 150 in greater detail.

The insulating block 150 is an elongated ceramic electrically insulating block constructed from 99% pure alumina ($Al_2O_3$). The insulating block 150 has a first generally flat surface 200 that extends the length and width of the insulating block. This flat surface 200 engages a cathode mounting flange 202 (FIG. 17) that extends from the rear wall 130*e* of the gas confinement or arc chamber 76. On a side of the insulating block 150 opposite the first surface 200, the insulating block 150 defines a generally planar cathode support surface 210 for supporting the cathode 124 and a second generally planar filament support surface 212 for supporting the cathode filament 178 in spaced relation to the cathode inner tubular member 162. As seen most clearly from the plan view of FIG. 9, the cathode support surface 210 has two corner notches 220, 221 having openings 222, 223 that extend through a reduced width of the insulating block 150 defined by the notches.

Two connectors 224 (FIG. 7) having enlarged heads 225 extend through these openings 222, 223 and attach the insulating block 150 to the flange 202 on the arc chamber 76. The connectors 224 are threaded along their length. These connectors engage threaded openings 204 (FIG. 17) in the flange 202. A backing plate 206 (FIG. 7) also includes threaded openings into which the connectors extend to securely fasten the insulating block 150 to the arc chamber 76. When the insulating block 150 is attached to the arc chamber 76, the first generally flat surface 200 extends at a generally perpendicular angle to the back wall 130*e* of the arc chamber. Two locating pins 203 extend away from a surface 202*a* of the flange 202. These pins fit into corresponding openings 226 (FIG. 11) that extend into the surface 200 of the insulator 150 to help align the insulating block 150 during installation.

METAL MOUNTING PLATE 152

Figure 19:
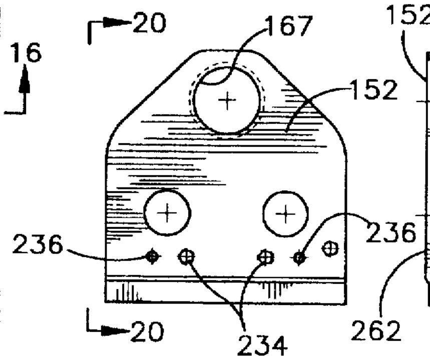
FIG. 19 is a plan view of a mounting plate for mounting the cathode body for positioning within the arc chamber.

As seen in the Figures, the metal mounting plate 152 that supports the three piece cathode body 300 rests against the cathode support surface 210 of the insulating block 150 and extends away from that surface to bring the cathode body 300 into alignment with the arc chamber opening 158. Threaded connectors 228 extend into a two recessed wells 230 (FIG. 11) in the surface 200 of the insulating block 150 and pass through openings 232 in the block to engage threaded openings 234 (FIG. 19) in the plate 152.

Figure 20:
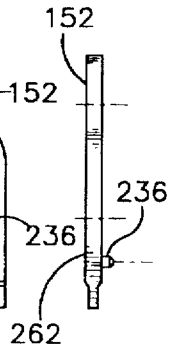
FIG. 20 is a view of the mounting plate as seen from the line 20—20 in FIG. 19.
Figure 16:
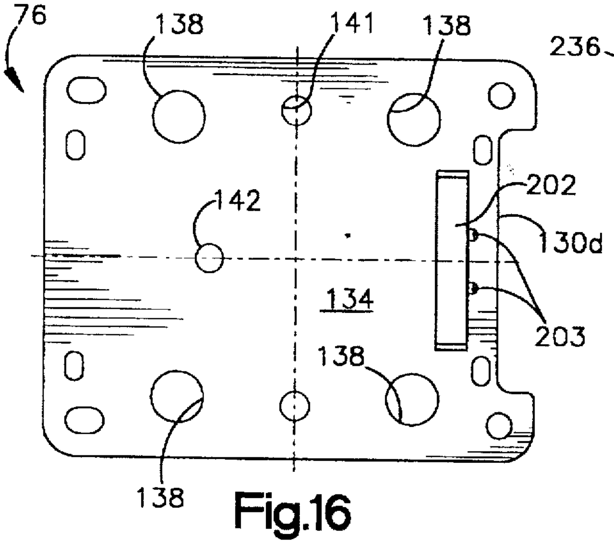
FIG. 16 is a view of the arc chamber as seen from the plane 16—16 of FIG. 15.

Two locating pins 236 (FIGS. 19 and 20) are carried by the mounting plate 152. As the mounting plate 152 is attached to the insulating block 150 these pins extend into alignment holes 238 (FIG. 9) in the block 150. This helps align the block 150 and the plate 152 and facilitates connection of the two during fabrication of the cathode 124 as well as during maintenance of the cathode 124 after use in the implanter 10.

Once the metal mounting plate 152 is attached to the block 150 and the block attached to the arc chamber 76, the threaded opening 167 (FIG. 19) in the mounting plate 152 that positions the three piece cathode body 300 is aligned with respect to the opening 158 that extends through the wall 130*d* in the arc chamber 76.

Planar surfaces 240 (FIG. 7) of the elongated arms 170, 171 engage and are supported by the insulating block surface 212 (FIG. 12) that is spaced from the opposite surface 200 by a maximum thickness of the insulating block 150. Threaded connectors 250 (FIG. 5) having enlarged heads extend through openings 252 in the arms 170, 171 and thread into threaded openings 254 in the filament support surface 212. As seen most clearly in FIG. 7, the relative spacing between the two planar surfaces 210, 212 of the insulating block 150 defines a gap G between the surface 240 of the arms 170, 171 and a surface 262 (FIGS. 7 and 19) of the plate 152. The gap G and the fact that the ceramic insulating block 150 is made of an electrically insulating material electrically isolates the two arms (170, 171) not only from each other but from the mounting plate 152 that supports the cathode body 300. The holes 252 in the filament support arms 170, 171 align with the holes 254 in the insulating body 150 and accurately position the filament 178 within the inside cavity C of the cathode body 300.

Figure 10:
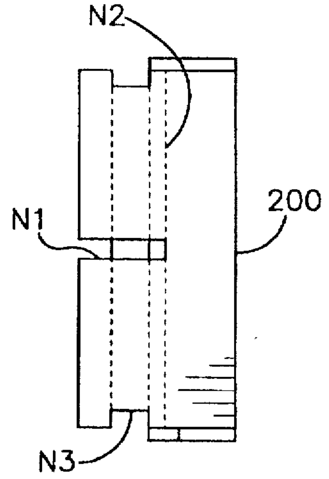
FIG. 10 is a view from the plane 10—10 of FIG. 9.
Figure 11:
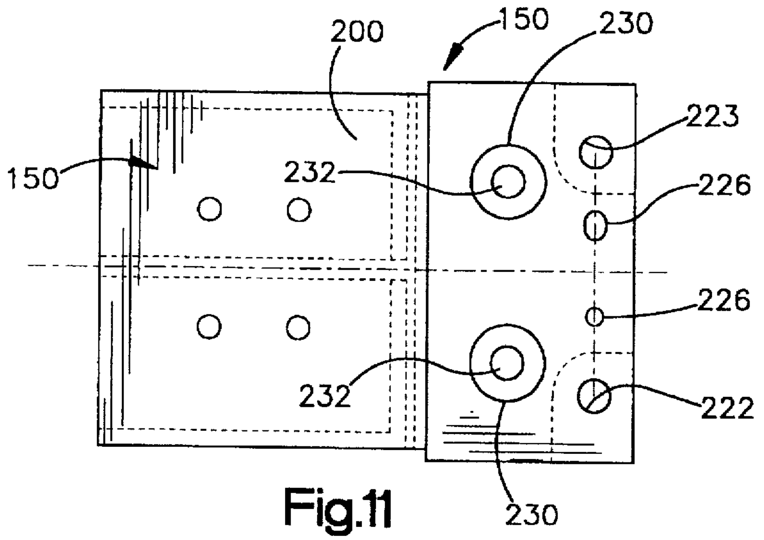
FIG. 11 is a bottom plan view of the insulating block shown in FIG. 9.

As seen in FIGS. 9–12, the ceramic insulating block 150 of the insulator defines a number of elongated notches or channels N1–N3 (FIG. 10). These notches N1–N3 disrupt the generally planar surfaces of the insulating block 150. When mounted near the arc chamber 76, the insulating block 150 is coated with electrically conductive deposits. The insulators disclosed in the '006 patent were subject to surface coating during operation of the source. This coating could lead to premature arc-over or shorting and failure of the source. The channels N1–N3 in the single block insulator 150 make the block self-shadowing, i.e., the ions do not coat a continuous surface across the insulating block 150 and are therefore less prone to arc over.

CATHODE ENDCAP 164

The cathode cap 164 is a machined tungsten thermionic emitter that provides arc current to the arc chamber. The simple disk shaped cathode endcap disclosed in the '006 patent is replaced with the endcap 164, which while being compatible with the cathode structure shown in the '006 patent has several distinct advantages.

Figure 13A:
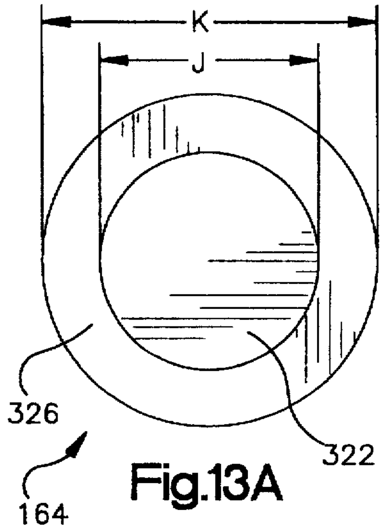
FIG. 13A is a top plan view of the cathode endcap of FIG. 13.
Figure 13B:
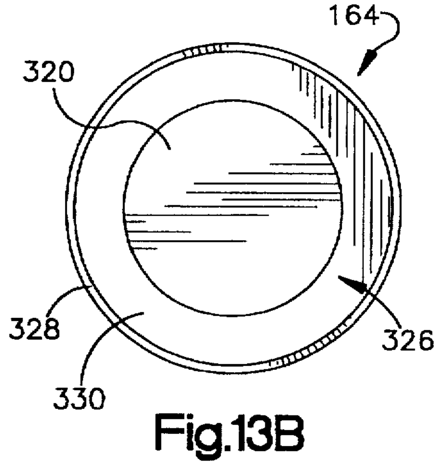
FIG. 13B is a bottom plan view of the cathode endcap of FIG. 13
Figure 13:
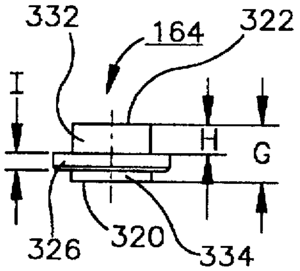
FIG. 13 is a side elevation view of a cathode endcap that emits ionizing electrons into an arc chamber interior during operation of the ion source.
Figure 12:
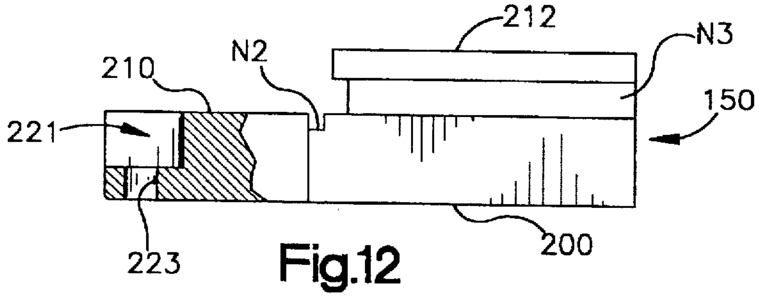
FIG. 12 is a partially sectioned side elevation view of the insulating block shown in FIG. 9.
Figure 14:
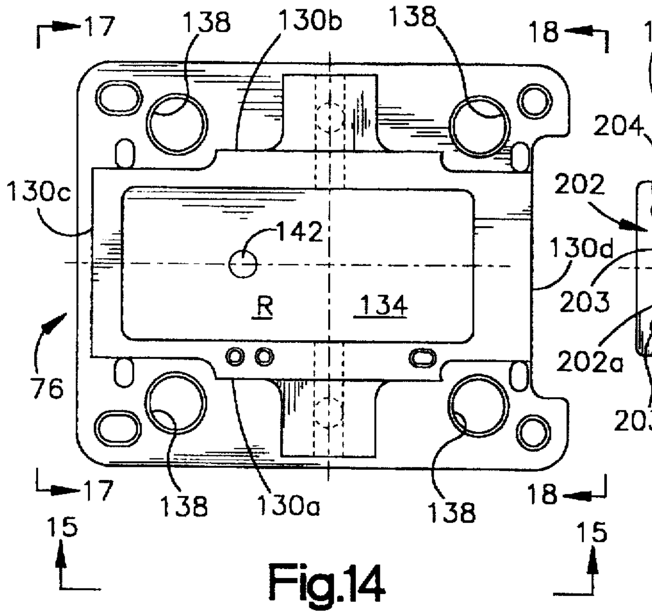
FIG. 14 is a front elevation view of the ion source arc chamber.
Figure 17:
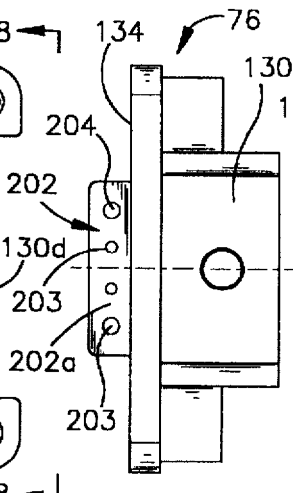
FIG. 17 is a view of the arc chamber as seen from the plane 17—17 of FIG. 14.
Figure 18:
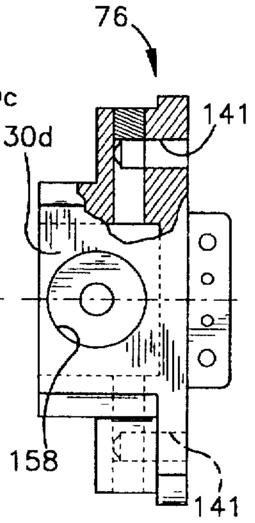
FIG. 18 is a view of the arc chamber as seen from the plane 18—18 of FIG. 14.
Figure 15:
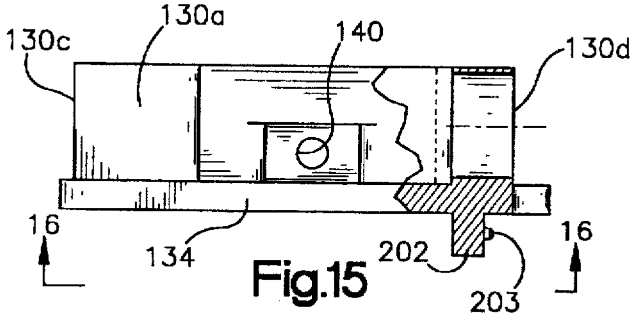
FIG. 15 is a view of the arc chamber as seen from the plane 15—15 of FIG. 14.

The endcap 164 (FIGS. 13, 13A, 13B) of the cathode body 300 is conductive and is made from a wrought tungsten material. The endcap 164 is generally cylindrical and includes a first end 320 and a second end 322 spaced apart by a body portion 324. The first end 320 is adjacent to and is heated by the filament 178 while the second end 322 emits electrons into the arc chamber 78. A rim shaped support or rim 326 extends radially outwardly from the body portion 324. The endcap 164 is press fit into the counterbored region 312 of the distal end 308 of the inner tubular member 162. The inwardly extending ridge 314 of the inner tubular member 162 has an inner diameter (0.472 inches) slightly smaller than an outer diameter of the rim shaped support 326 (0.473 inches) of the endcap 164 thereby causing an interference fit. To aid in press fitting the endcap 164 into the inner tubular member 162, an outer peripheral edge 328 of a filament facing side 330 of the rim shaped support is chamfered. Additionally, as can best be seen in FIG. 6A, a portion of the filament facing side 330 of the rim shaped support 326 just inward of the chamfered edge 328, is seated on the step 316 of the inner tubular member 162 which defines the boundary between the counterbored region 312 and noncounterbored regions of the inner surface 301. Thus, the endcap 164 is held in place during operation of the ion implanter 10 by the interference fit between the extending ridge 314 of the inner tubular member 162 and the rim shaped support 326 of the endcap 164 as well as the seating of the filament facing side 330 of the rim shaped support 326 on the step 316. A distal portion 332 of the body 324 portion of the endcap 164 extends upwardly into the arc chamber 76 beyond the distal ends of the inner and outer tubular members 162, 160. A proximal portion 334 of the body portion 324 extends downwardly from the rim shaped support 326 toward the filament 178. Referring to FIGS. 13 and 13A, suitable dimensions for the endcap 164 are:

| Description | Label | Dimension |
|---|---|---|
| Overall length | G | 0.224 inches |
| Length of distal portion of body portion | H | 0.112 inches |
| Length of rim portion | I | 0.068 inches |
| Outer diameter of body portion | J | 0.320 inches |
| Outer diameter of rim portion | K | 0.474 inches |

As the filament 178 is energized, the endcap 164 is heated and the second or emitter end 322 emits electrons into the arc chamber 76. As can best be seen in FIG. 2, the cathode body 300 is positioned such that the first and second tubular members 160,162 extend through the opening 158 in the arc chamber wall 130d and into the arc chamber interior region R. The emitter end 322 of the endcap 164 is approximately aligned with a lower end 336 of the exit aperture 78.

The small area of contact between the endcap 164 and the inner tubular member 162 minimizes the thermal transfer from the filament 178 to the inner and outer tubular members 162, 160 and the metal mounting plate 152 thereby increasing cathode life. Further, the extending rim of the endcap 164 permits the cylindrical body portion 324 of the endcap to have a substantially reduced cross sectional area as compared to the cross sectional area of the inner tubular member 162. The cross sectional area, A1, of the inner tubular member 162 (noncounterbored portion) is approximately equal to:

$$A1 = \pi \times [(\text{inner diameter})^2/4] = 0.1612 \text{ square inches}$$

The cross sectional area, A2, of the body portion 324 of the endcap 164 is approximately equal to:

$$A2 = \pi \times [(\text{outer diameter})^2/4] = 0.0804 \text{ square inches}$$

Thus, the cross sectional area of the endcap 164 is essentially 50% of the cross sectional area of the inner tubular member 162.

The small area of contact between the endcap 164 and the inner tubular member 162 significantly reduces the heat transferred from the endcap 164 to the inner tubular member and the insulating block 150. Further, the reduced cross sectional area of the endcap 164 provides for more efficient use of filament heating power, thus, less power is required for a given desired are current. For a given filament power level, the smaller cross sectional area of the second or emitter end 322 of the endcap 164 results in an increased current density of the arc current flowing into the arc chamber 76 and a higher emitter end temperature.

The combination of higher electron current density and higher emitter end temperatures also results in higher fractions of multiply-charged ions. The increased arc current density (due to the reduced emission area) and higher emitter end temperatures (due to smaller thermal mass and improved emitter thermal isolation) advantageously provide for: a)increased disassociation of singly charged ions e.g., disassociation of $BF_3$ and $BF_2$); and b) increased production of multiply charged ions, e.g., increased production of B++ and B+++. Further, the endcap 164 of the present invention permits a higher arc current to be achieved using the existing arc chamber controller electronics. From the above description of a preferred embodiment of the invention, those skilled in the art will perceive improvements, changes and modifications. Such improvements, changes and modifications within the skill of the art are intended to be covered by the appended claims.

Having described a preferred embodiment of the invention, I claim:

1. An ion source for use in an ion implanter, said ion source comprising:

a) a confinement chamber having chamber walls that bound an ionization region and including an exit opening to allow ions to exit the confinement chamber;

b) means for delivering an ionizable material into the confinement chamber;

c) structure for supporting the confinement chamber in a position for forming an ion beam from the confinement chamber;

d) a cathode positioned with respect to the ionization region of the confinement chamber to emit ionizing electrons into the ionization region of the confinement chamber to produce ions within the ionization region, the cathode including a heat source positioned in an electrically isolated cathode body, the cathode body including a first tube and an endcap supported in a distal end of the first tube adjacent the heating source, the endcap emitting said ionizing electrons into the ionization region of the gas confinement chamber when heated by the heat source; and e) the endcap including a first end and a second end spaced apart from said first end by a body portion and having a radially projecting support extending outwardly from the body portion which contacts an inner surface of the first tube to support the endcap within the distal end of the first tube, the radially projecting support having a thickness in an axial direction less than a thickness in an axial direction of the body portion.

2. The ion source of claim 1 wherein the endcap is comprised of tungsten and the radially projecting support of the endcap comprises a rim extending outwardly from the endcap body portion.

3. The ion source of claim 2 wherein an outer peripheral surface of the rim contacts the inner surface of the first tube to support the endcap within the first tube distal end.

4. The ion source of claim 3 wherein the distal end of the first tube includes a portion having a radially inwardly projecting ridge and the outer peripheral surface of the rim contacts the ridge to support the endcap within the first tube distal end.

5. The ion source of claim 1 wherein the first end of the endcap is positioned adjacent the heat source and the second end of the endcap extends through an opening in the confinement chamber and emits said ionizing electrons into the ionization region.

6. The ion source of claim 1 wherein the heat source is a filament supported by an insulator block.

7. The ion source of claim 6 wherein an outer surface of the first tube includes a threaded portion which threadedly engages a metal mounting block to support the cathode body and the metal mounting block is affixed to the insulator block.

8. The ion source of claim 1 wherein the cathode body additionally includes a second tube coaxial with the first tube and overlying at least a portion of the first tube distal end.

9. The ion source of claim 8 wherein an outer surface of the first tube includes a threaded portion and an inner surface of the second tube includes a threaded portion which threadedly engages the first tube.

10. The ion source of claim 1 wherein at least a portion of the cathode body extends through an opening of the confinement chamber into the ionization region.

11. A cathode for emitting ionizing electrons into an ionization region of a confinement chamber to ionize gas molecules, the cathode comprising:

a) a cathode body including a first tube and an electron emitting endcap supported in a distal portion of the first tube;

b) a heat source positioned in the first tube adjacent the endcap to heat the endcap resulting in the emission of said ionizing electrons, the heat source being electrically isolated from the cathode body; and c) the endcap including a first end and a second end spaced apart from said first end by a body portion and having a radially projecting support extending outwardly from the body portion which contacts an inner surface of the first tube to support the endcap within the distal portion of the first tube, the radially projecting support having a thickness in an axial direction less than a thickness in an axial direction of the endcap body portion.

12. The cathode of claim 11 wherein the endcap is comprised of tungsten and the radially projecting support of the endcap comprises a rim extending outwardly from the endcap body portion.

13. The cathode of claim 12 wherein an outer peripheral surface of the rim contacts the inner surface of the first tube to support the endcap within the first tube distal portion.

14. The cathode of claim 13 wherein the distal portion of the first tube includes a region having a radially inwardly projecting ridge and the outer peripheral surface of the rim contacts the ridge to support the endcap within the first tube distal portion.

15. The cathode of claim 11 wherein the first end of the endcap is positioned adjacent the heat source and the second end of the endcap extends through an opening in the confinement chamber and emits said ionizing electrons into the ionization region.

16. The cathode of claim 15 wherein the heat source is a filament supported by an insulator block.

17. The cathode of claim 16 wherein an outer surface of the first tube includes a threaded portion which threadedly engages a metal mounting block to support the cathode body and the metal mounting block is affixed to the insulator block.

18. The cathode of claim 11 wherein the cathode body additionally includes a second tube coaxial with the first tube and overlying at least a portion of the first tube distal portion.

19. The cathode of claim 18 wherein an outer surface of the first tube includes a threaded portion and an inner surface of the second tube includes a threaded portion which threadedly engages the first tube.

20. The cathode of claim 11 wherein at least a portion of the cathode body extends through an opening of the confinement chamber into the ionization region.

21. A cathode body endcap supported in a distal end of a tube for emitting ionizing electrons into an ionization region of a confinement chamber to produce ions within the ionization region, the endcap comprising a first end and a second end spaced apart from said first end by a body portion and having a radially projecting support extending outwardly from the body portion, the second end of the endcap positioned with respect to the ionization region of the confinement chamber to emit said ionizing electrons into the ionization region and the first end of the endcap adjacent a heat source, the endcap emitting said ionizing electrons into the ionization region of the confinement chamber when heated by the heat source, the radially projecting support contacting an inner surface of the tube to support the endcap within the distal end of the tube, the radially projecting support having a thickness in an axial direction less than a thickness in an axial direction of the endcap body portion.

22. The endcap of claim 21 wherein the endcap is comprised of tungsten and the radially projecting support of the endcap comprises a rim extending outwardly from the endcap body portion.

23. The endcap of claim 22 wherein an outer peripheral surface of the rim contacts the inner surface of the tube to support the endcap within the first tube distal end.

24. The endcap of claim 23 wherein the tube distal end includes a counterbored region with a radially inwardly projecting ridge and the outer peripheral surface of the rim contacts the ridge and a rim shaped support of the endcap contacts a radially inwardly stepped portion of the tube inner surface bounding the counterbored region to support the endcap within the tube distal end.

* * * * *